(12) United States Patent
Robertson (10) Patent No.: US 12,332,781 B2
(45) Date of Patent: Jun. 17, 2025

(54) VERIFICATION PROCESS FOR BIT SPREADING ERROR RESISTANT MEMORY SYSTEM

(71) Applicant: BAE SYSTEMS Information and Electronic Systems Integration Inc., Nashua, NH (US)

(72) Inventor: Jeffrey E. Robertson, Ashburtn, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 65 days.

(21) Appl. No.: 18/470,111

(22) Filed: Sep. 19, 2023

(65) Prior Publication Data

US 2025/0094342 A1    Mar. 20, 2025

(51) Int. Cl.
*G06F 12/02* (2006.01)
*G06F 11/10* (2006.01)

(52) U.S. Cl.
CPC ...... *G06F 12/0292* (2013.01); *G06F 11/1044* (2013.01); *G06F 2212/1008* (2013.01)

(58) Field of Classification Search
CPC ............ G06F 12/0292; G06F 11/1044; G06F 2212/1008
USPC .......................................... 711/104; 716/106
See application file for complete search history.

(56) References Cited

U.S. PATENT DOCUMENTS

| | | |
|---|---|---|
| 6,941,499 B1 | 9/2005 | Sung et al. |
| 7,143,332 B1 | 11/2006 | Trimberger |
| 7,353,438 B2 | 4/2008 | Leung et al. |
| 8,112,730 B2 | 2/2012 | Aleksanyan et al. |
| 8,145,961 B2 | 3/2012 | Arnez et al. |
| 9,460,811 B2 | 10/2016 | Braceras et al. |
| 10,108,512 B2 | 10/2018 | Halbert et al. |
| 10,387,276 B2 | 8/2019 | Ryu et al. |

(Continued)

FOREIGN PATENT DOCUMENTS

| | | |
|---|---|---|
| EP | 0281740 A3 | 5/1990 |
| EP | 2287740 B1 | 1/2013 |
| WO | WO2013016390 A2 | 1/2013 |

OTHER PUBLICATIONS

International Search Report, PCT/US24/47355, mailed Dec. 9, 2024, 9 pages.

*Primary Examiner* — Jared I Rutz
*Assistant Examiner* — Wei Ma
(74) *Attorney, Agent, or Firm* — Gary McFaline (57) ABSTRACT

Techniques are provided for design verification of a bit spreading memory. A methodology implementing the techniques according to an embodiment includes using a bit spreading geometry file to convert a logical address of the memory to a physical address. The geometry file defines a scheme by which bits of a data word stored at the logical address are spread over multiple RAMs. The method also includes writing data bits of a test data word to the physical address, causing a design simulator to simulate a read from the logical address, and comparing the result to the test data word for verification. The method further includes causing the design simulator to simulate a write of the test data word to the logical address, reading data bits from the physical address, arranging the bits into a retrieved data word, and comparing the test data word to the retrieved data word for verification.

17 Claims, 8 Drawing Sheets

(56) References Cited

U.S. PATENT DOCUMENTS

| | | |
|---|---|---|
| 10,803,971 B2 | 10/2020 | Pyo et al. |
| 11,055,173 B2 | 7/2021 | Ranjan et al. |
| 11,309,048 B2 | 4/2022 | Choi et al. |
| 11,579,969 B2 | 2/2023 | Yang et al. |
| 2003/0051197 A1* | 3/2003 | Evans .................... G11C 29/12 |
| | | 714/718 |
| 2014/0157088 A1 | 6/2014 | Chih et al. |
| 2015/0067448 A1 | 3/2015 | Son et al. |
| 2020/0194093 A1 | 6/2020 | Chen et al. |
| 2021/0050068 A1* | 2/2021 | Schat .................... G11C 29/52 |
| 2022/0196735 A1 | 6/2022 | Atsatt et al. |
| 2023/0186004 A1* | 6/2023 | Zhu ......................... G06F 30/33 |
| | | 716/106 |

* cited by examiner

VERIFICATION PROCESS FOR BIT SPREADING ERROR RESISTANT MEMORY SYSTEM

STATEMENT OF GOVERNMENT INTEREST

This invention was made with United States Government assistance under Contract Nos. N00164-20-9-G009b and 100115865, awarded by the National Security Technology Accelerator agency. The United States Government has certain rights in this invention.

FIELD OF DISCLOSURE

The present disclosure relates to memory systems, and more particularly to a design verification technique for a bit spreading error resistant memory system.

BACKGROUND

In many applications, a given memory for storing data is largely reliable and immune to error, such that bits stored in the memory are adequately maintained. Depending on the given application, however, it is possible that interference can cause one or more bits of a given memory to flip or otherwise change states, thus corrupting the memory. For instance, memory systems deployed in space-based applications are subjected to relatively high radiation levels which can cause a significant increase in single-bit, multi-bit, and single event functional interrupt (SEFI) errors. In some cases, these memory-corrupting errors can render the memory non-functional. Shielding can reduce the radiation exposure, but this approach may not be practical for all applications due to, for instance, the added weight (e.g., requiring lead or similarly dense materials), particularly in space-based applications where stringent weight constraints may be imposed. Redundant memories that use majority voting techniques can reduce error rates, but this approach also increases cost and complexity to a degree that may not be practical in many applications. Error correction coding (ECC) schemes exist, but these also have limitations.

Although the following Detailed Description will proceed with reference being made to illustrative embodiments, many alternatives, modifications, and variations thereof will be apparent in light of this disclosure.

DETAILED DESCRIPTION

Techniques are provided herein for a design verification technique for an error resistant bit spreading memory system. As noted above, memory systems deployed in space-based applications are subjected to relatively high radiation levels which can cause a significant increase in single-bit, multi-bit, and SEFI errors. The bit spreading memory system is configured to provide radiation hardened memory operation, for example, to reduce radiation induced single event effect susceptibility in which a single radiation event can corrupt multiple bits or an entire Random Access Memory (RAM), by spreading out data bits for storage over multiple RAMs.

The design of a memory system employing these bit spreading techniques needs to be tested or verified prior to fabricating hardware (e.g., a memory chip). A design simulator may be used to simulate operation of the bit spreading memory based on a specified design (e.g., a design specified by a register transfer level (RTL) description). It is not sufficient, however, to simply simulate a write followed by a read to verify that the data that was written matches the data that was read back, since this does not verify that the bits of the data were spread over multiple RAMs according to an intended bit spreading scheme. For example, an error in the design of the memory could cause the bit spreading function to be bypassed entirely and that fact would not be detected by a simple write/read combination. As such, the memory would appear to work, but would not provide the desired improvements to mitigate radiation induced errors.

To this end, and in accordance with an embodiment of the present disclosure, a design verification process for an error resistant memory (ERM) system that employs bit spreading techniques is disclosed. The disclosed process verifies that read and write operations to a logical address of the memory (e.g., sequential addresses as they would appear externally to a device using the memory) actually store the individual bits of a data word in a manner that spreads those bits over multiple RAMs according to the intended bit spreading plan. In this context the term "physical address" (as used below) refers to the mapping of bits across the RAMs of a bit spreading memory, which, for clarification, is different from a traditional use of the term "physical address" to refer to a view of memory from a memory bus perspective. The term RAM, as used herein, may refer to any type of random access memory including static RAMs (SRAMs), dynamic RAMs (DRAMS), synchronous dynamic RAMs (SDRAMS), etc.

In accordance with an embodiment, a methodology for the design verification process includes using a bit spreading geometry file to convert a logical address of the memory to a physical address, wherein the bit spreading geometry file defines a bit spreading scheme by which data bits of a data word stored at the logical address are stored in a spread fashion over a plurality of RAMs of the memory. The method also includes writing data bits of a test data word to the physical address and causing a design simulator to simulate a read from the logical address. The method further includes comparing the result of the simulated read from the logical address to the test data word written to the physical address, for verification of the read function of the design. The method further includes causing the design simulator to simulate a write of the test data word to the logical address, reading back data bits from the associated physical address, and arranging the data bits to form a retrieved data word. The method further includes comparing the test data word to the retrieved data word, for verification of the write function of the design.

It will be appreciated that the techniques described herein may provide reliable verification of the bit spreading function of the design of the error resistant memory. Additionally, the use of a bit spreading geometry file provides testing flexibility by removing the bit spreading scheme details from the verification software, thus allowing one version of software to handle different designs. Numerous embodiments and applications will be apparent in light of this disclosure.

System Architecture

Figure 1:
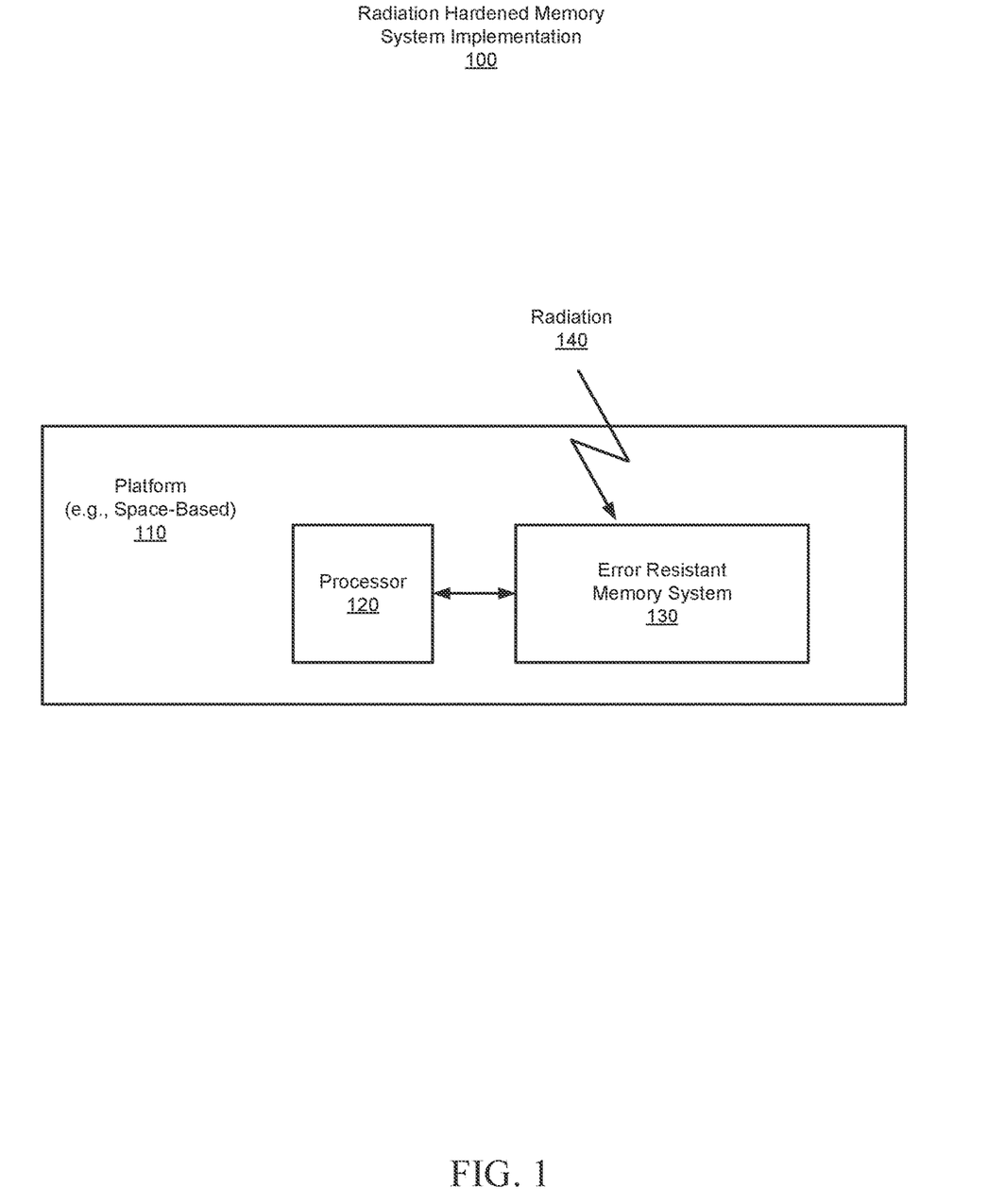
FIG. 1 illustrates an implementation of a radiation hardened error resistant memory system, in accordance with an embodiment of the present disclosure.

FIG. 1 illustrates an implementation 100 of a radiation hardened error resistant memory system, in accordance with certain embodiments of the present disclosure. The implementation 100 is shown to include a processor 120 and an error resistant memory system 130, hosted on a platform 110. In some embodiments, the platform 110 is a space-based or aerospace platform that can be subject to radiation 140 at greater levels of intensity compared to earth-based platforms. Other applications include those that may operate in environments with high levels of ionizing radiation such as military and nuclear applications.

The operation of the error resistant memory system 130 will be described in greater detail below, but at a high level, error resistant memory system 130 is configured to detect and correct errors (e.g., errors caused by radiation effects or from other sources). In some embodiments, the error resistant memory system 130 employs ECC codes that are associated with a group of data bits and that can correct a single bit error that occurs within that group of data bits. The ECC codes can also detect, but not necessarily correct, a double bit error within the group of data bits. The error resistant memory system provides improved resilience to errors by distributing the groups of data bits and associated ECC codes over a number of separate RAMs, such that bit errors in any one of the RAMs, or even a failure of an entire single RAM, can be corrected, as will be explained below.

Figure 2:
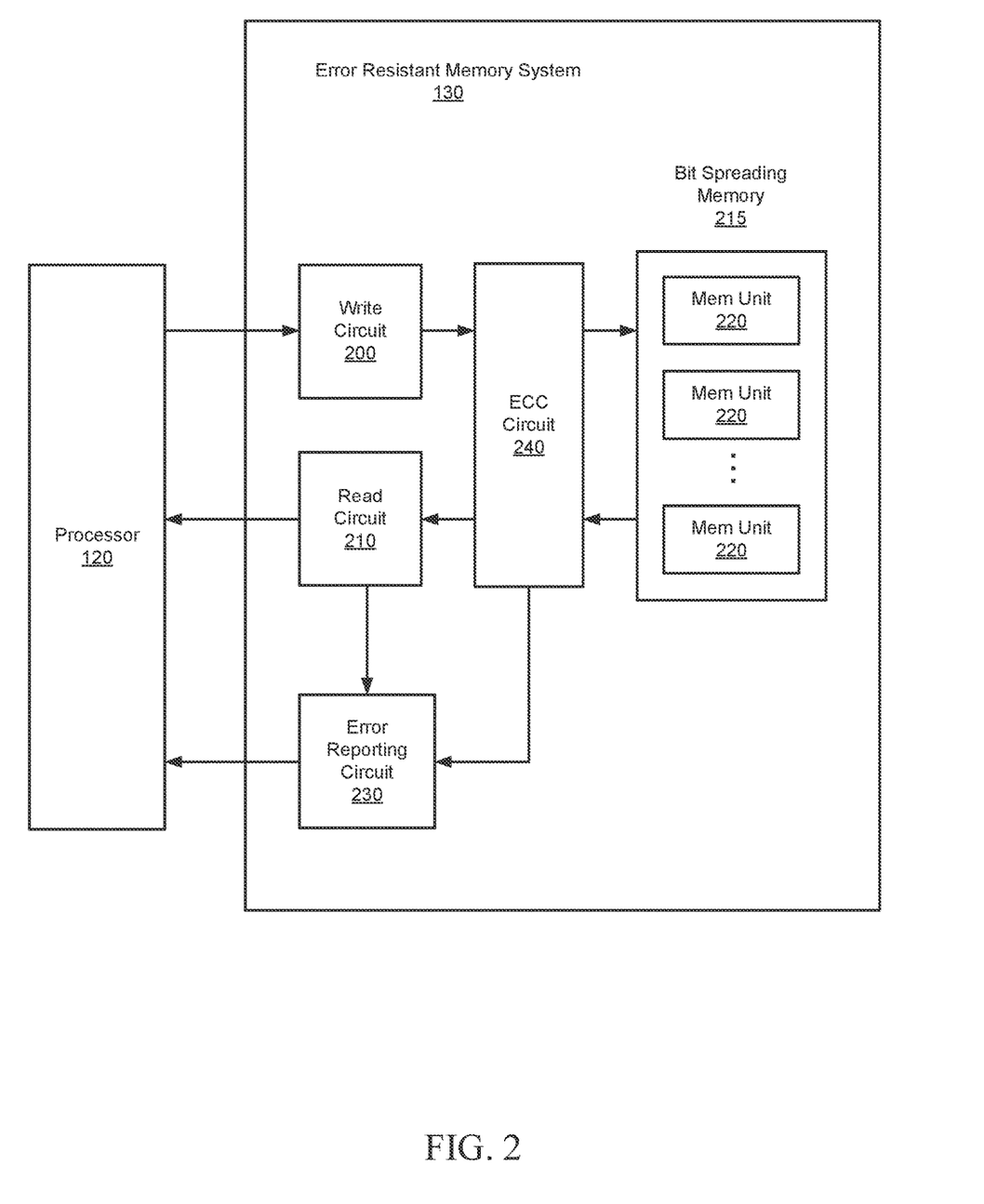
FIG. 2 is a block diagram of the error resistant memory system of FIG. 1, configured in accordance with an embodiment of the present disclosure.

FIG. 2 is a block diagram of the error resistant memory system 130 of FIG. 1, configured in accordance with certain embodiments of the present disclosure. The error resistant memory system 130 is shown to include a memory write circuit 200, a memory read circuit 210, a bit spreading memory 215 (comprising a number of bit spreading memory units 220), an error reporting circuit 230, and an ECC circuit 240.

The memory write circuit 200 is configured to accept data words from the processor 120, or any other suitable source, and write them to the bit spreading memory 215. The data words may be of any desired bit length. In some embodiments, for example, the data words may be 8 bits, 16 bits, 32 bits, 64 bits, or 128 bits, although other lengths are possible including lengths that are not necessarily a power of 2.

The memory read circuit 210 is configured to read data words from the bit spreading memory 215, for example at the request of the processor, and provide those data words back to the processor or any other suitable destination.

The bit spreading memory 215 comprises a number of bit spreading memory units 220. In some embodiments, each of the memory units 220 is configured to store a data word. A memory unit may be selected by an address that accompanies a memory write operation or a memory read operation. The address thus specifies which memory unit 220, of the memory 215, the data word is to be written to or read from. The memory units 220 are configured to store a data word in an error resistant manner by distributing data bits of the data word, along with an ECC code, over a number of separate RAMs in the memory unit. In some embodiments, the RAMs may be configured to store more than one data word and the multiple words may be selectable by addresses. The operation of memory units of varying sizes is described in greater detail below in connection with FIGS. 3 and 4, but looking at FIG. 4, for example, a 32 bit data word is broken up into 4 groups of data bits (e.g., bits 0-7, 8-15, 16-23, and 24-31) and each data group is spread over 8 RAMs (RAMS 0-7). As also shown in FIG. 4, an ECC code associated with each data group is spread over 5 additional RAMs (e.g., W0, W1, W2, W3 and W4 over RAMs 8-12).

The size of the memory 215 can be configured based on the memory requirements of the application (e.g., mission software running on the processor 120) or on any other suitable considerations. For example, if a 1K memory of 32 bit data words is required, then the memory 215 can comprise 1K memory units 220, each configured to store 32 bit data words. As previously noted, in some embodiments, each RAM may be configured to store multiple words, so the number of memory units may be reduced accordingly. For example, if the RAMs were configured to store 16 words, then only 64 memory units (e.g., 1024/16) would be needed.

The ECC circuit 240 is configured to generate ECC codes for each of the groups of data bits, for example when a data word is written to the memory unit. In some embodiments, the ECC codes are configured to detect and correct a single bit error in the group of data bits, and to detect a double bit error in the group of data bits. In some embodiments, the ECC code may be a Hamming code, although other suitable single bit error correction codes may be used. In some embodiments, the ECC codes are of length M bits, where $M=\log_2(N)+2$ bits, where N is the number of bits in the data group for which the ECC code is being generated.

The ECC circuit 240 is also configured to use the ECC codes to detect and possibly correct errors in each of the groups of data bits, for example when a data word is read from the memory unit.

The error reporting circuit 230 is configured to report any single bit error corrections or double bit error detections that occur. In some embodiments, the reporting may be directed back to the processor which may use the information to track the error rates and take any appropriate action.

Figure 3:
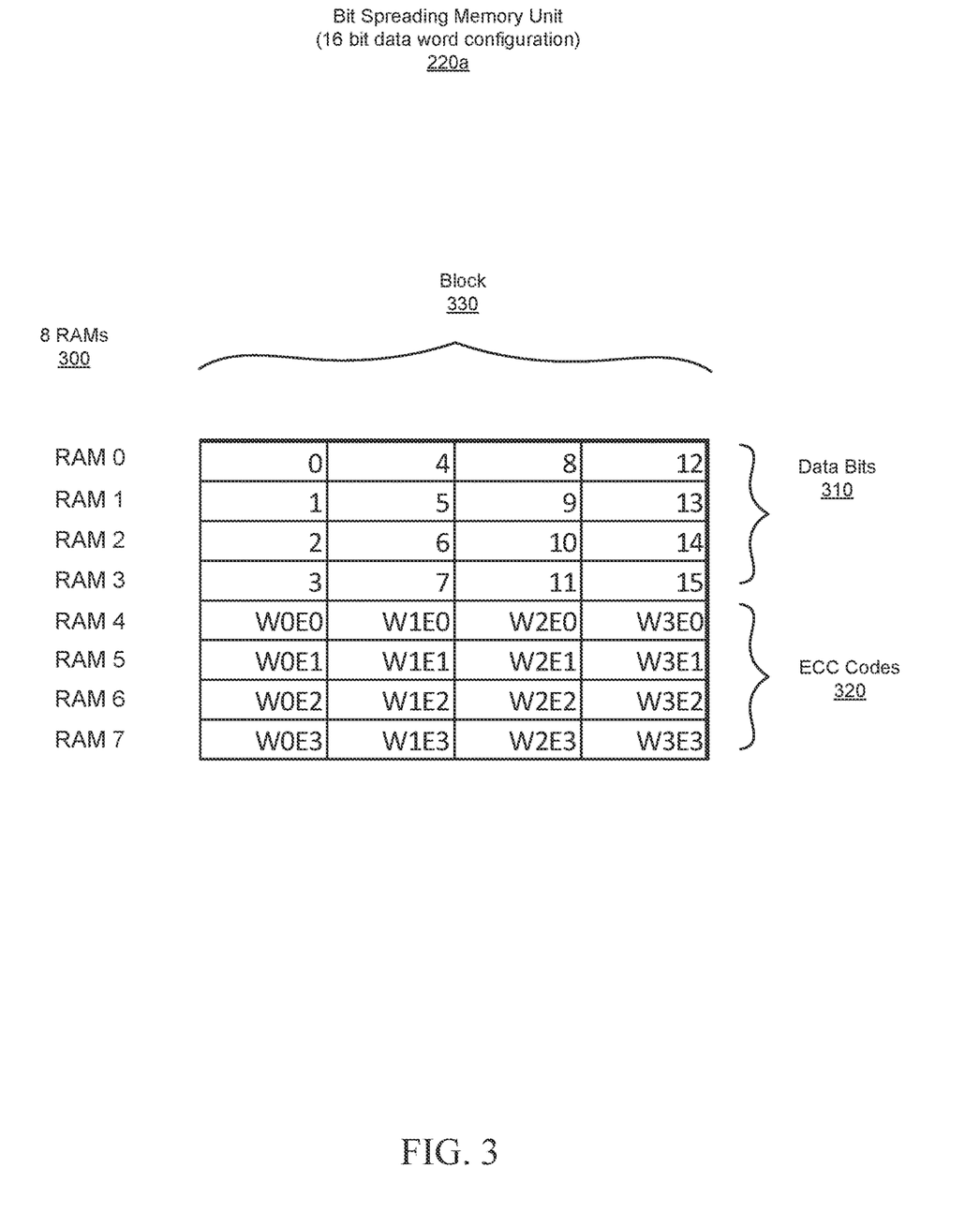
FIG. 3 is an illustration of a bit spreading memory unit, of the error resistant memory system of FIG. 1, configured for 16 bit data words, in accordance with an embodiment of the present disclosure.
Figure 4:
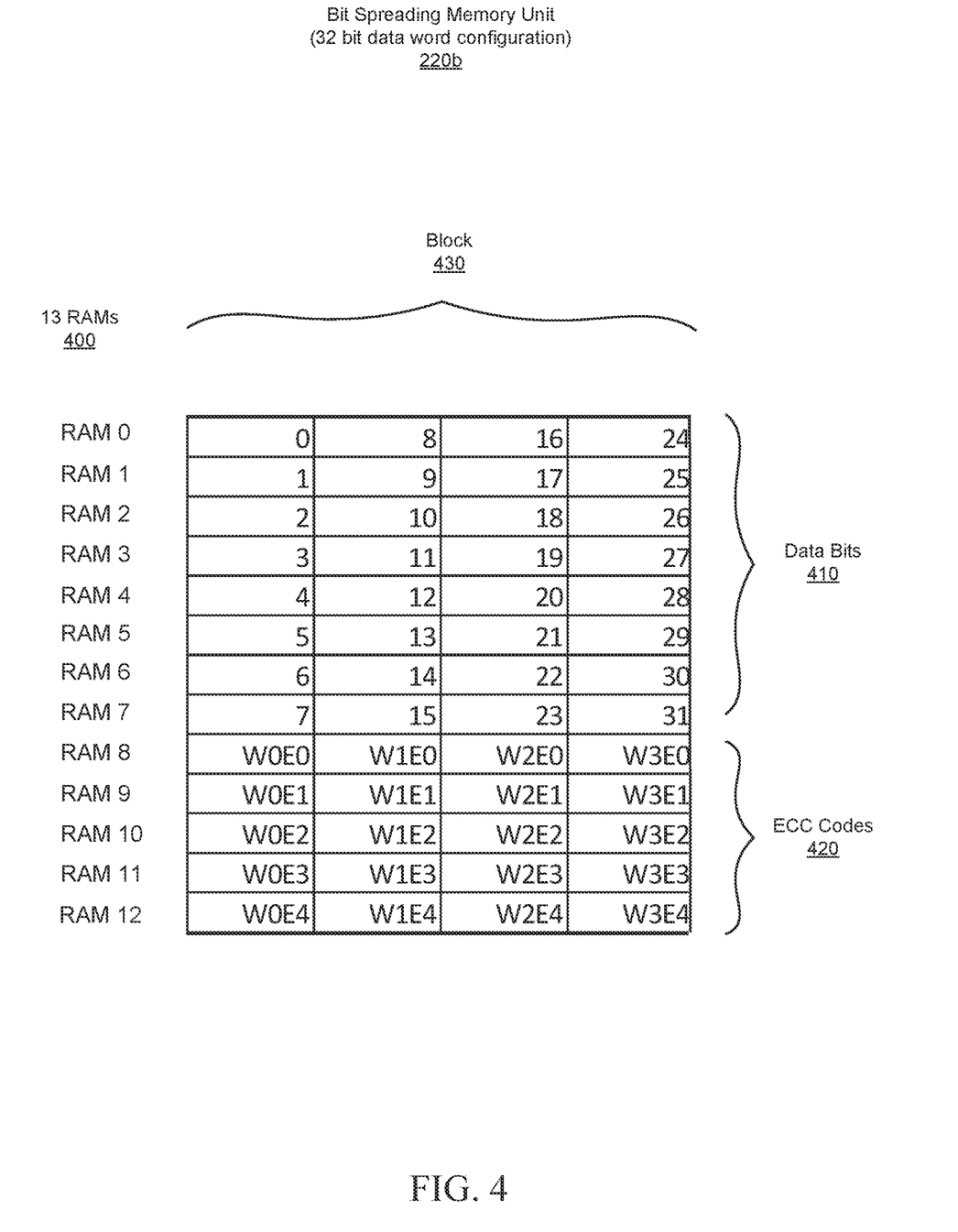
FIG. 4 is an illustration of a bit spreading memory unit, of the error resistant memory system of FIG. 1, configured for 32 bit data words, in accordance with another embodiment of the present disclosure.

FIG. 3 is an illustration of a bit spreading memory unit 220a, of the error resistant memory system 130 of FIG. 1, configured for 16 bit data words, in accordance with certain embodiments of the present disclosure. The memory unit 220a is shown to include eight RAMs 300, each configured to store four bits, which is referred to as a block 330 of four bits. The first four RAMs are configured to store the 16 data bits 310 of the data word written to the memory unit, as shown. In this example, no two consecutive bits of the data word written to the memory unit are stored in the same RAM, so as to spread the bits across the four RAMs. In particular, a first group of data bits (0-3) are stored or distributed over RAMs 0-3 in a first column effectively formed by the RAMs. Likewise, a second group of data bits (4-7) are stored in a second column effectively formed by the RAMs, a third group of data bits (8-11) are stored in a third column effectively formed by the RAMs, and a fourth group of data bits (12-15) are stored in a fourth column effectively formed by the RAMs.

The remaining four RAMs are configured to store four bit ECC codes 320 associated with groups of data bits (e.g., the columns of RAMs 0-3). The first ECC code, W0E0 through W0E3 is distributed over the first column of RAMs 4-7 and is associated with data bits 0-3. Likewise, the second ECC code, W1E0-W1E3 is distributed over the second column of RAMs 4 7 and is associated with data bits 4-7. The third ECC code, W2E0-W2E3 is distributed over the third column of RAMs 4-7 and is associated with data bits 8-11. Lastly, the fourth ECC code, W3E0-W3E3 is distributed over the fourth column of RAMs 4-7 and is associated with data bits 12-15.

If an error occurs in any single bit of a group of data bits (the columns of the RAMs), that error can be corrected based on the ECC code associated with that data bit group. For example, if data bit 0 were corrupted, it could be restored based on ECC code W0. If an entire RAM were to be corrupted (e.g., a SEFI), all of the data bits in that RAM could be restored based on the ECC codes W0-W3. Likewise, a single data bit error in any or all of the groups of data bits (columns) can be corrected.

An overhead factor OF can be defined as the total number of RAMs employed by the memory unit divided by the number of RAMs used to store data. In this example case, for 16 bit data words, four of the eight RAMs are used to store data and thus the overhead factor OF=2.0. As the size of the data word increases, the efficiency increases, as will be seen in the following case.

In some embodiments, the memory unit may be increased in size by including additional blocks, for example to store multiple words as previously mentioned. For example, in a two block memory unit RAM 0 would comprise an additional block so that a total of 8 bits can be stored in that RAM rather than just 4. This would allow the memory unit to store two 16 bit words rather than just one 16 bit word. Any number of additional blocks may be employed depending on the desired memory size and application requirements.

Additionally, any number of memory units may be grouped together to form what is referred to as a memory complex, and any number of complexes may be disposed on a physical memory chip. Furthermore, any number of memory chips may be employed in the error resistant memory system 130.

FIG. 4 is an illustration of a bit spreading memory unit 220b, of the error resistant memory system 130 of FIG. 1, configured for 32 bit data words, in accordance with certain embodiments of the present disclosure. The memory unit 220b is shown to include 13 RAMs 400, each configured to store four bits, which is referred to as a block 430 of four bits. The first eight RAMs are configured to store the 32 data bits 410 of the data word written to the memory unit, as shown. In particular, a first group of data bits (0-7) are stored or distributed over RAMs 0-7 in the first column of the RAMs. Likewise, a second group of data bits (8-15) are stored in the second column, a third group of data bits (16-23) are stored in the third column, and a fourth group of data bits (24-31) are stored in the fourth column.

The remaining five RAMs are configured to store five bit ECC codes 420 associated with groups of data bits (e.g., the columns of RAMs 0-7). The first ECC code, W0E0 through W0E4 is distributed over the first column of RAMs 8-12 and is associated with data bits 0-7. Likewise, the second ECC code, W1E0-W1E4 is distributed over the second column of RAMs 8-12 and is associated with data bits 8-15. The third ECC code, W2E0-W2E4 is distributed over the third column of RAMs 8-12 and is associated with data bits 16-23. Lastly, the fourth ECC code, W3E0-W3E4 is distributed over the fourth column of RAMs 8-12 and is associated with data bits 24-31. As previously described if an error occurs in any single bit of a group of data bits (the columns of the RAMs), that error can be corrected based on the ECC code associated with that data bit group.

In this example case, for 32 bit data words, eight of the 13 RAMs are used to store data and thus the efficiency overhead factor OF=1.625, which is an improvement over the previously described case for 16 bit data words.

Once again, in some embodiments, the memory unit may be increased in size by including additional blocks to store multiple words, as previously mentioned. For example, in a two block memory unit RAM 0 would comprise an additional block so that a total of 8 bits can be stored in that RAM rather than just 4. This would allow the memory unit to store two 32 bit words rather than just one 32 bit word.

It will be appreciated that other memory unit configurations are possible and can be adapted to any desired application. For example, the number of RAMs, the number of blocks per RAM, and the number of bits per block may be selected for a memory unit based on application requirements. Additionally, the number of memory units in a complex, the number of complexes on a chip, and the number of chips may be configured as needed.

Figure 5:
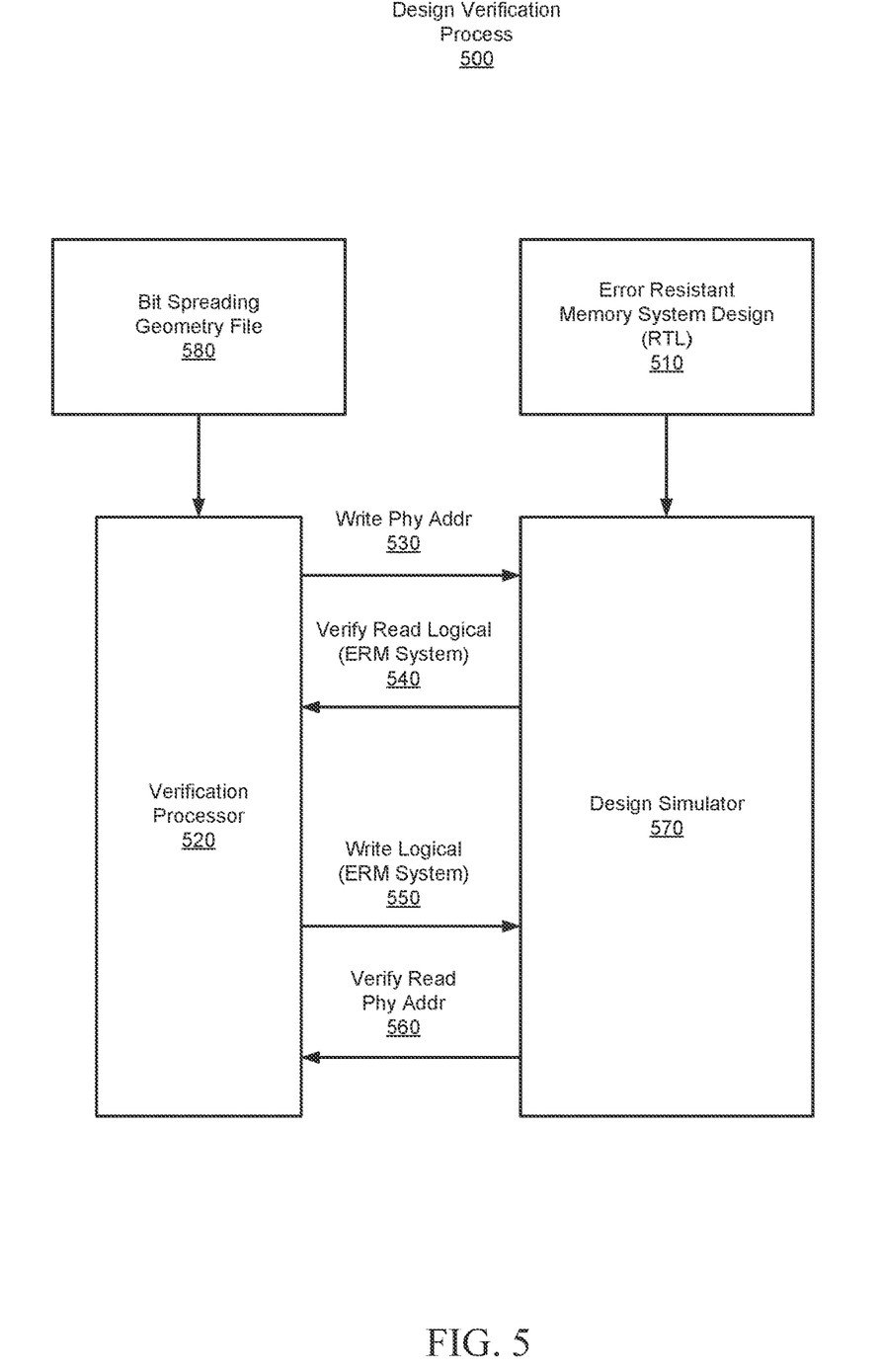
FIG. 5 is an illustration of a design verification process for the error resistant memory system of FIG. 1, in accordance with certain embodiments of the present disclosure.

FIG. 5 is an illustration of a design verification process 500 for the error resistant memory system 130 of FIG. 1, in accordance with certain embodiments of the present disclosure. The design verification process is shown to include an RTL description 510 of the error resistant (bit spreading) memory 130, a design simulator 570, a verification processor 520, and a bit spreading geometry file 580.

In the description of the design verification process 500, reference is made to "logical addresses" and "physical addresses." Logical addresses represent memory addresses as viewed from a device that accesses the memory. For example, the memory may be configured to start at logical address 0x80000000 and store 32 bit data words, in which case the logical address of the first data word is 0x80000000, the logical address of the second data word is 0x80000001, etc. The notation "0x" indicates hexadecimal. Physical addressing refers to access of the spread bits that correspond to a given logical address. For example, with reference to the bit spreading memory unit 220b, the physical address of the first byte of the first 32 bit data word (e.g., logical address 0x80000000) may refer to the first column of RAMs 0-7, of the first block of the memory unit. Likewise, the physical address of the second byte of the first 32 bit data word may refer to the second column of RAMs 0-7, of the first block of the memory unit, etc. Similarly, the physical address of the first byte of the second 32 bit data word (e.g., logical address 0x80000001) may refer to the first column of RAMs 0-7, of the second block of the memory unit, and so forth.

The design of the error resistant memory 130 may be expressed as an RTL abstraction 510 using a hardware description language such as Verilog. In some embodiments, circuit design tools may generate this RTL description of the memory as part of the design process. A design simulator 570 is configured to execute a simulation of the error resistant memory 510 based on the RTL description of the memory system. Any suitable design simulator may be used. The verification processor 520 is configured to drive the design simulator 570 to verify that the memory 510 is designed correctly. The verification approach may, for example, use Verilog and the Universal Verification Methodology (UVM) standard. For example, the verification processor 520 tests that read and write operations on the memory are performed using the disclosed bit spreading techniques, as will be described in greater detail below. In some embodiments, the verification processor 520 is also implemented as software coded in Verilog or some other hardware description language (HDL) executable by a simulator or one or more processors. The bit spreading geometry file 580 is configured to provide details related to the layout of the memory (as described by the RTL 510) or a portion thereof, particularly with respect to how the bits are spread, for use by the verification processor 520, as described below. For example, the bit spreading geometry file defines a bit spreading scheme by which data bits of a data word stored at a logical address are stored in a spread fashion over a plurality of RAMs of the memory.

An example geometry file is shown in table 1 below. This geometry file corresponds to the bit spreading memory unit for 32 bit data words 220b as illustrated in FIG. 4. The first line of the file is a header which includes a logical base address and a size (e.g., in bytes) for this memory unit. In this example, the size would be just four bytes since memory unit 220b stores just one 32 bit word.

TABLE 1

| Base Address (logical address); Size in bytes |
| --- |
| Number of blocks; Bits per block; /chipx/complexa/ram0 |
| Number of blocks; Bits per block; /chipx/complexa/ram1 |
| Number of blocks; Bits per block; /chipx/complexa/ram2 |
| Number of blocks; Bits per block; /chipx/complexa/ram3 |
| Number of blocks; Bits per block; /chipx/complexa/ram4 |
| Number of blocks; Bits per block; /chipx/complexa/ram5 |
| Number of blocks; Bits per block; /chipx/complexa/ram6 |
| Number of blocks; Bits per block; /chipx/complexa/ram7 |
| Number of blocks; Bits per block; /chipx/complexa/ram8 |
| Number of blocks; Bits per block; /chipx/complexa/ram9 |
| Number of blocks; Bits per block; /chipx/complexa/ram10 |
| Number of blocks; Bits per block; /chipx/complexa/ram11 |
| Number of blocks; Bits per block; /chipx/complexa/ram12 |

Each of the subsequent lines describe the bit spreading geometry of each RAM using a format comprising {number of blocks, number of bits per block, part name}. For example, in the case of memory unit 220b, the second line of the geometry file would specify that the number of blocks is 1 and the number of bits per block is 4. In this example, the RAM is labeled with a part name of "chipx/complexa/ram0," to indicate that it is part of a grouping called "complex A" on a chip referred to as "chip X." Part name labeling conventions can conform to any suitable format. Each of the remaining lines follow this format for the subsequent 12 RAMs.

The geometry of the memory unit, that is used for verification purposes, can be readily modified by changing the number of blocks per part, the number of bits per block, and/or the number of RAM geometry lines. Furthermore, additional geometry files can be created to represent additional memory components located at different base addresses which may be of different sizes and layouts and may be located in other complexes.

Employing a bit spreading geometry file 580 provides testing flexibility by removing the bit spreading scheme details from the verification software 520, thus allowing one version of software to handle different designs. Additionally, multiple bit spreading schemes can be easily created by copying and editing the geometry file 580 for different projects.

The verification processor 520 is configured to test memory read and write operations to verify that the disclosed bit spreading techniques are correctly implemented in the memory design. In some embodiments, a process to test a memory read operation may comprise the operation 530 of performing a write of data to a physical address of the memory, and then, at operation 540, instructing the design simulator to exercise the design to read data from the logical address corresponding to that physical address. If the data that is read back from the logical address matches the data that was written to the physical address, the bit spreading memory design is verified to be correct for reading from that logical address. The memory read verification process will be described in greater detail below in connection with FIG. 6.

In some embodiments, a process to test a memory write operation may comprise the operation 550 of instructing the design simulator to exercise the design to write data to a logical address of the memory, and then, at operation 560, performing a read of data from the physical address corresponding to the logical address. If the data that is read back from the physical address matches the data that was written to the logical address, the bit spreading memory design is verified to be correct for writing to that logical address. The memory write verification process will be described in greater detail below in connection with FIG. 7.

These operations can be repeated for any number of logical memory addresses for which design verification is desired.

Methodology

Figure 6:
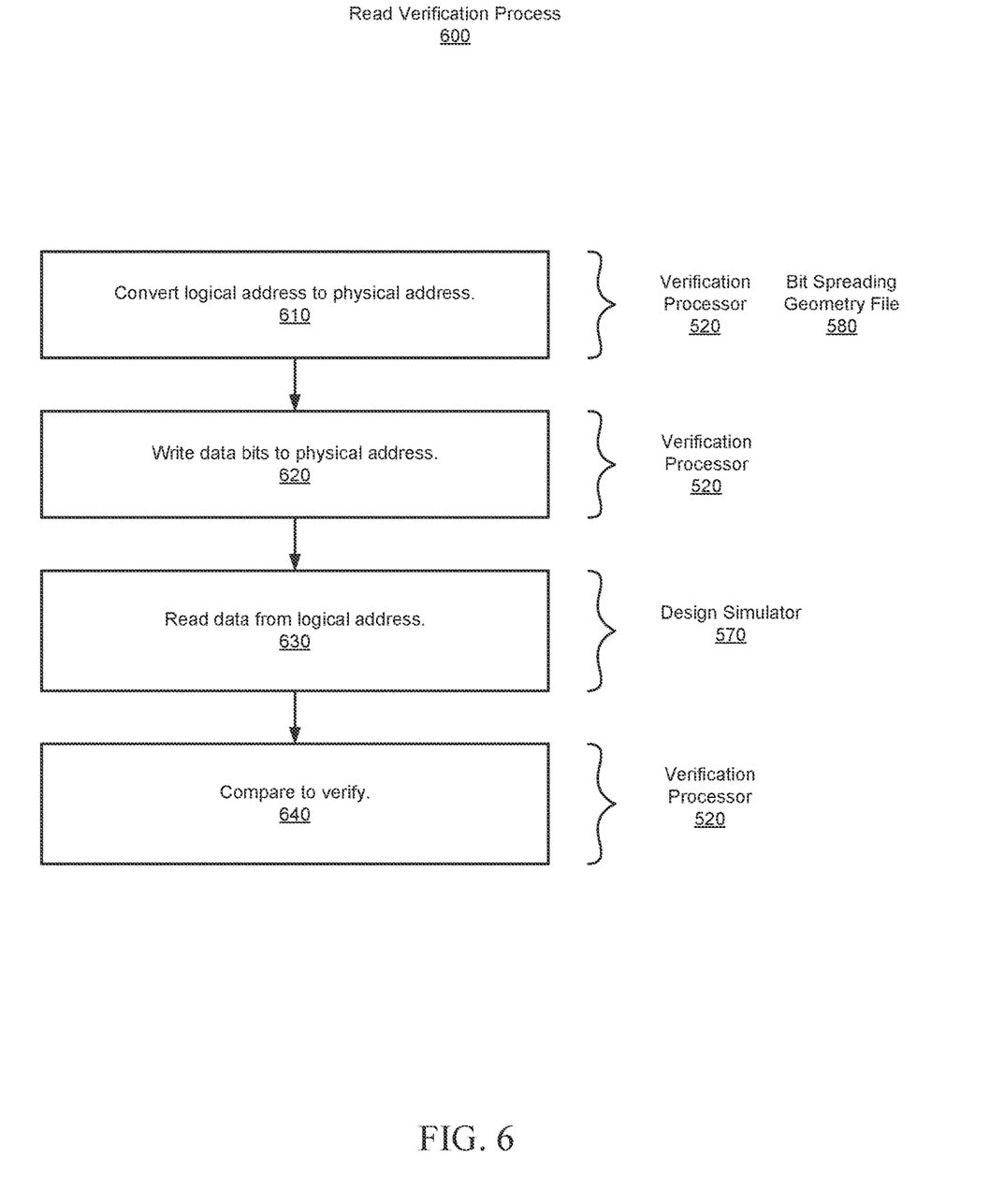
FIG. 6 is a flowchart illustrating a methodology for a memory read verification, of the design verification process of FIG. 5, in accordance with an embodiment of the present disclosure.
Figure 7:
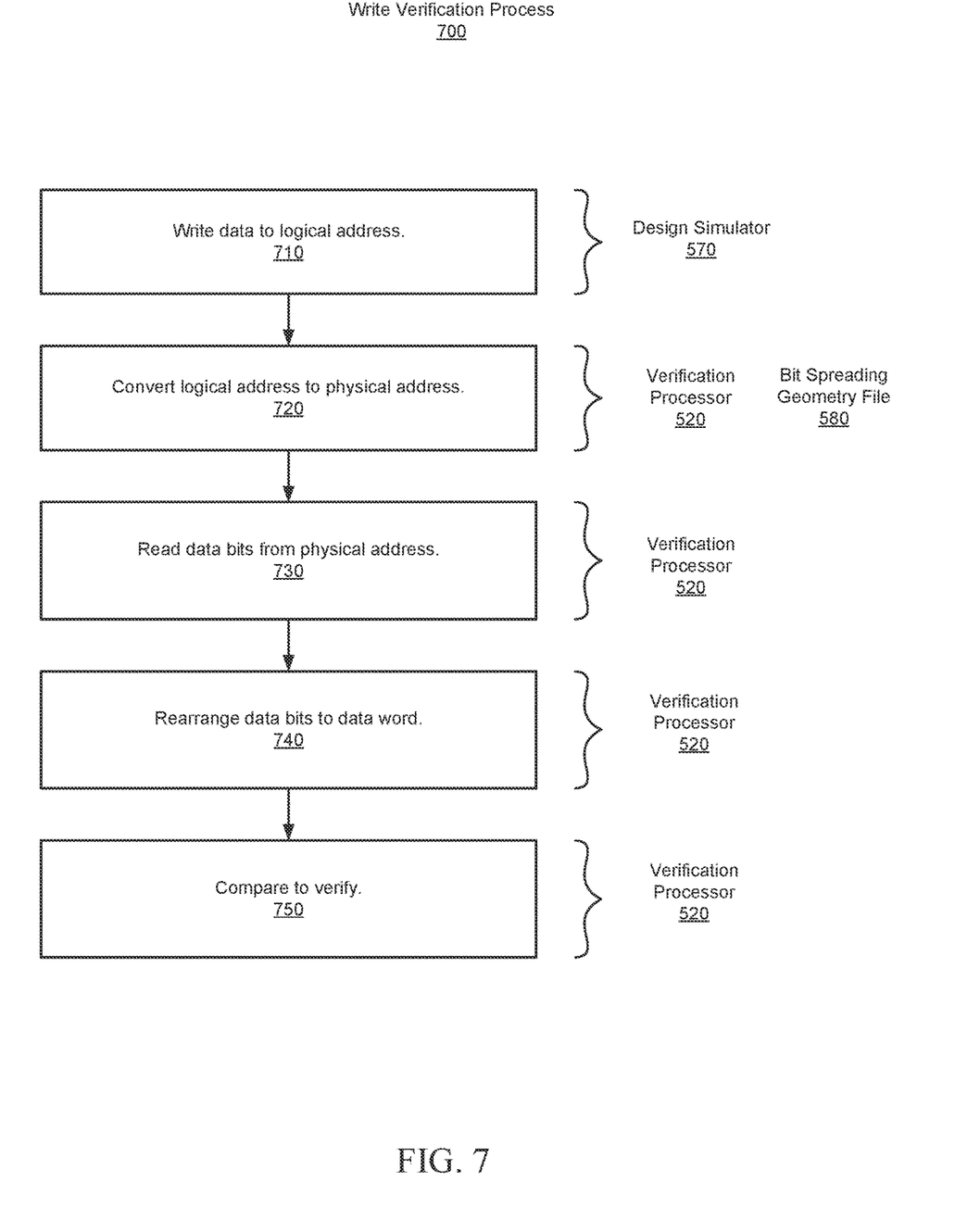
FIG. 7 is a flowchart illustrating a methodology for a memory write verification, of the design verification process of FIG. 5, in accordance with an embodiment of the present disclosure.

FIGS. 6 and 7 are flowcharts illustrating methodologies 600 and 700 for memory read verifications and memory write verifications, respectively, as part of the design verification process, in accordance with an embodiment of the present disclosure. As can be seen, example methods 600 and 700 include a number of phases and sub-processes, the sequence of which may vary from one embodiment to another. However, when considered in aggregate, these phases and sub-processes form a process for providing verification of the design of an error resistant memory, in accordance with certain of the embodiments disclosed herein, for example as illustrated in FIGS. 1-5, as described above. However other system architectures can be used in other embodiments, as will be apparent in light of this disclosure. To this end, the correlation of the various functions shown in FIGS. 6 and 7 to the specific components illustrated in the figures, is not intended to imply any structural and/or use limitations. Rather other embodiments may include, for example, varying degrees of integration wherein multiple functionalities are effectively performed by one system. Numerous variations and alternative configurations will be apparent in light of this disclosure.

In one embodiment, method 600 comprises a read verification process which commences, at operation 610, by converting a logical address that is to be read tested, to a physical address based on the bit spreading geometry file. The bit spreading geometry file defines a bit spreading scheme by which data bits of a data word stored at a logical address are stored in a spread fashion over a plurality of RAMs. As an example, assume the memory unit 220b, of FIG. 4, is located at logical address 0x8000000 and is of size 0x1000 (i.e., stores 4096, 32 bit data words). Each RAM would therefore have 0x1000 blocks, each block storing 4 bits. If the logical address to be verified is 0x8000020, that would refer to the 32nd byte of the memory unit, or the eighth 32 bit data word. The physical address would therefore map to the eighth block.

At operation 620, bits of a data word (along with a calculated ECC) are written to the physical address. Continuing with the example described below for the write verification process, the write to the physical address would proceed as:

write data word [0] to/chipx/complexa/ram0[bit 0] [block 8]
write data word [1] to/chipx/complexa/ram1 [bit 0] [block 8]
write data word [2] to/chipx/complexa/ram2 [bit 0] [block 8]
write data word [3] to/chipx/complexa/ram3 [bit 0] [block 8]
. . .
write data word [28] to/chipx/complexa/ram4 [bit 3] [block 8]
write data word [29] to/chipx/complexa/ram5 [bit 3] [block 8]
write data word [30] to/chipx/complexa/ram6 [bit 3] [block 8]
write data word [31] to/chipx/complexa/ram7 [bit 3] [block 8]
Continue for ECC Bits At operation 630, the design simulator is directed to perform a read of the data word from the logical address that is being read tested.

At operation 640, the data word (and ECC) that is read from the logical address is compared to the data word that was written to the physical address, at operation 620. If the comparison matches, then the read verification process (e.g., the simulator reading from a logical address) is successful.

In one embodiment, method 700 comprises a write verification process which commences, at operation 710, by directing the design simulator to perform a write of a data word to a logical address that is to be write tested. If the design is correct, the simulator will write the data using the disclosed bit spreading technique.

At operation 720, the verification process converts the logical address to a physical address based on the bit spreading geometry file. The address conversion is performed as described above in operation 610 of the read verification process.

At operation 730, bits are read from the physical address (including ECC bits). Continuing with the example above, the read would access
/chipx/complexa/ram0 [bit 0] [block 8]
/chipx/complexa/ram0 [bit 1] [block 8]
/chipx/complexa/ram0 [bit 2] [block 8]
/chipx/complexa/ram0 [bit 3] [block 8]
/chipx/complexa/ram1 [bit 0] [block 8]
/chipx/complexa/ram1 [bit 1] [block 8]
/chipx/complexa/ram1 [bit 2] [block 8]
/chipx/complexa/ram1 [bit 3] [block 8]
. . .
/chipx/complexa/ram12 [bit 3] [block 8]

At operation 740, the read bits are rearranged to form a read data word and a read ECC. Continuing with the same example, the rearrangement would proceed as:

read data word [0]=/chipx/complexa/ram0[bit 0] [block 8]
read data word [1]=/chipx/complexa/ram1 [bit 0] [block 8]
read data word [2]=/chipx/complexa/ram2 [bit 0] [block 8]
read data word [3]=/chipx/complexa/ram3 [bit 0] [block 8]
. . .
read data word [28]=/chipx/complexa/ram4 [bit 3] [block 8]
read data word [29]=/chipx/complexa/ram5 [bit 3] [block 8]
read data word [30]=/chipx/complexa/ram6 [bit 3] [block 8]
read data word [31]=/chipx/complexa/ram7 [bit 3] [block 8]
. . .
Continue for ECC Bits At operation 750, the data word that is read from the physical address is compared to the data word that was written to the logical address, at operation 710. Additionally, the ECC code may also be verified for correctness. If the comparison matches and the ECC code is verified to be correct, then the write verification process (e.g., the simulator writing to a logical address) is successful.

Example System

Figure 8:
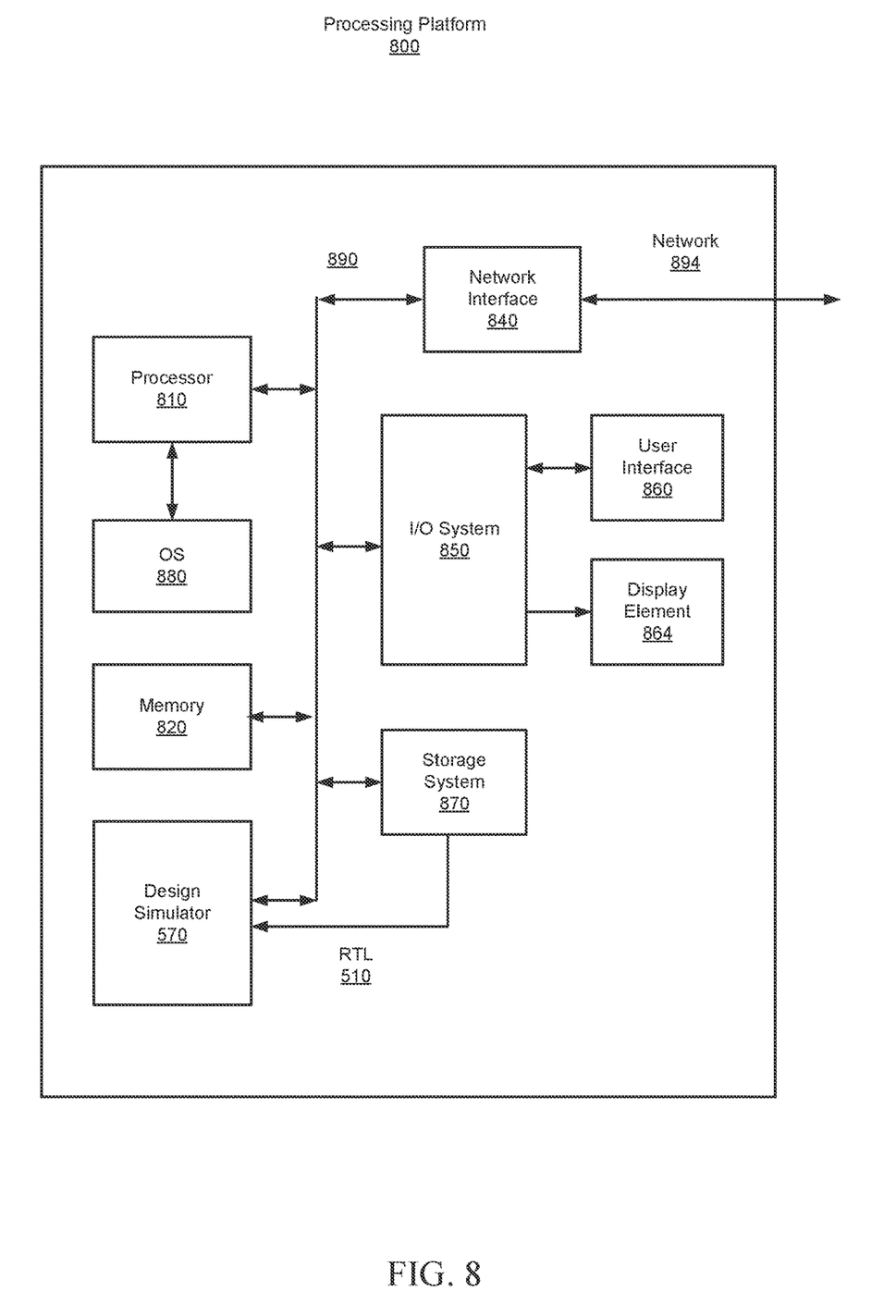
FIG. 8 is a block diagram of a processing platform configured to provide a design verification process for the error resistant memory system of FIG. 1, in accordance with an embodiment of the present disclosure.

FIG. 8 is a block diagram of a processing platform 800 configured to provide a design verification process for the error resistant memory system 130 of FIG. 1, in accordance with an embodiment of the present disclosure. The disclosed techniques may be used to provide improved design verification that can detect potential errors in the bit spreading operation of the memory.

In some embodiments, platform 800 may comprise any combination of a processor 810, memory 820, a network interface 840, an input/output (I/O) system 850, a user interface 860, a display element 864, a storage system 870, and design simulator 570. As can be further seen, a bus and/or interconnect 890 is also provided to allow for communication between the various components listed above and/or other components not shown. Platform 800 can be coupled to a network 894 through network interface 840 to allow for communications with other computing devices, platforms, devices to be controlled, or other resources. Other componentry and functionality not reflected in the block diagram of FIG. 8 will be apparent in light of this disclosure, and it will be appreciated that other embodiments are not limited to any particular hardware configuration.

Processor 810 can be any suitable processor, and may include one or more coprocessors or controllers, such as an audio processor, a graphics processing unit, or hardware accelerator, to execute the design simulator and the verification process software. In some embodiments, the processor 810 may be implemented as any number of processor cores. The processor (or processor cores) may be any type of processor, such as, for example, a micro-processor, an embedded processor, a digital signal processor (DSP), a graphics processor (GPU), a tensor processing unit (TPU), a network processor, a field programmable gate array or other device configured to execute code. The processors may be multithreaded cores in that they may include more than one hardware thread context (or "logical processor") per core. Processor 810 may be implemented as a complex instruction set computer (CISC) or a reduced instruction set computer (RISC) processor. In some embodiments, processor 810 may be configured as an x86 instruction set compatible processor.

Memory 820 can be implemented using any suitable type of digital storage including, for example, flash memory and/or random access memory. In some embodiments, the memory 820 may include various layers of memory hierarchy and/or memory caches as are known to those of skill in the art. Memory 820 may be implemented as a volatile memory device such as, but not limited to, a RAM, dynamic RAM (DRAM), or static RAM (SRAM) device. Storage system 870 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device.

Processor 810 may be configured to execute an Operating System (OS) 880 which may comprise any suitable operating system, such as Google Android (Google Inc., Mountain View, CA), Microsoft Windows (Microsoft Corp., Redmond, WA), Apple OS X (Apple Inc., Cupertino, CA), Linux, or a real-time operating system (RTOS). As will be appreciated in light of this disclosure, the techniques provided herein can be implemented without regard to the particular operating system provided in conjunction with platform 800, and therefore may also be implemented using any suitable existing or subsequently-developed platform.

The design simulator 570 is configured to simulate execution of the error resistant memory 130 under control of the verification processor 520, as described previously, to verify the design of the error resistant memory 130. In some embodiments, the design of the error resistant memory 130 may be expressed as RTL 510 and provided to the design simulator, as described above with respect to FIG. 5.

Network interface circuit 840 can be any appropriate network chip or chipset which allows for wired and/or wireless connection between other components of platform 800 and/or network 894, thereby enabling platform 800 to communicate with other local and/or remote computing systems, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution) and 5G, Wireless Fidelity (Wi-Fi), Bluetooth, and/or Near Field Communication (NFC). Examples of wireless networks include, but are not limited to, wireless local area networks, wireless personal area networks, wireless metropolitan area networks, cellular networks, and satellite networks.

I/O system 850 may be configured to interface between various I/O devices and other components of platform 800. I/O devices may include, but not be limited to, user interface 860 and display element 864. User interface 860 may include devices (not shown) such as a touchpad, keyboard, and mouse, etc., for example, to allow the user to control the system. Display element 864 may be configured to display information to a user. I/O system 850 may include a graphics subsystem configured to perform processing of images for rendering on the display element 864. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 810 or any chipset of platform 800.

It will be appreciated that in some embodiments, the various components of platform 800 may be combined or integrated in a system-on-a-chip (SoC) architecture. In some embodiments, the components may be hardware components, firmware components, software components or any suitable combination of hardware, firmware or software.

In various embodiments, platform 800 may be implemented as a wireless system, a wired system, or a combination of both. When implemented as a wireless system, platform 800 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, platform 800 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other. Some embodiments may be described using the expression "each." This term is not intended to be limited to "each and every."

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the methodologies disclosed herein to be implemented. The instructions can be encoded using a suitable programming language, such as C, C++, object oriented C, Java, JavaScript, Visual Basic. NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 894. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments platform 800 may comprise additional, fewer, or alternative subcomponents as compared to those included in the example embodiment of FIG. 8.

The aforementioned non-transitory computer readable medium may be any suitable medium for storing digital information, such as a hard drive, a server, a flash memory, and/or RAM, or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method, process, and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smartphones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood, however, that other embodiments may be practiced without these specific details, or otherwise with a different set of details. It will be further appreciated that the specific structural and functional details disclosed herein are representative of example embodiments and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a computer program product including one or more non-transitory machine-readable mediums encoded with instructions that when executed by one or more processors cause a process to be carried out for verification of a design of a memory, the process comprising: using a bit spreading geometry file to convert a logical address of the memory to a physical address, wherein the bit spreading geometry file defines a bit spreading scheme by which data bits of a data word stored at the logical address are stored in a spread fashion over a plurality of random access memories (RAMs) of the memory; writing data bits of a test data word to the physical address; causing a design simulator to simulate a read from the logical address; and comparing a result of the simulated read to the test data word to verify the design of the memory.

Example 2 includes the computer program product of Example 1, wherein the process further comprises: causing the design simulator to simulate a write of the test data word to the logical address; reading data bits from the physical address; arranging the data bits to form a retrieved data word; and comparing the test data word to the retrieved data word to further verify the design of the memory.

Example 3 includes the computer program product of Examples 1 or 2, wherein the bit spreading geometry file is configured to specify a logical base address of the memory, a size of the memory, and a description of the each of the plurality of RAMs.

Example 4 includes the computer program product of Example 3, wherein the description of the each of the plurality of RAMs includes a number of blocks of the RAM, a number of bits of each of the blocks of the RAM, and an identifying label of the RAM.

Example 5 includes the computer program product of any of Examples 1-4, wherein the process iterates over additional logical addresses.

Example 6 includes the computer program product of any of Examples 1-5, wherein the design of the memory is represented as a register transfer level description configured for execution by the design simulator.

Example 7 includes the computer program product of any of Examples 1-6, wherein the process is implemented in Verilog and conforms to a Universal Verification Methodology.

Example 8 is a method for verification of a design of a memory, the method comprising: using, by a processor-based system, a bit spreading geometry file to convert a logical address of the memory to a physical address, wherein the bit spreading geometry file defines a bit spreading scheme by which data bits of a data word stored at the logical address are stored in a spread fashion over a plurality of random access memories (RAMs) of the memory; writing, by the processor-based system, data bits of a test data word to the physical address; causing, by the processor-based system, a design simulator to simulate a read from the logical address; and comparing, by the processor-based system, a result of the simulated read to the test data word to verify the design of the memory.

Example 9 includes the method of Example 8, further comprising: causing the design simulator to simulate a write of the test data word to the logical address; reading data bits from the physical address; arranging the data bits to form a retrieved data word; and comparing the test data word to the retrieved data word to further verify the design of the memory.

Example 10 includes the method of Examples 8 or 9, wherein the bit spreading geometry file is configured to specify a logical base address of the memory, a size of the memory, and a description of the each of the plurality of RAMs.

Example 11 includes the method of Example 10, wherein the description of the each of the plurality of RAMs includes a number of blocks of the RAM, a number of bits of each of the blocks of the RAM, and an identifying label of the RAM.

Example 12 includes the method of any of Examples 8-11, wherein the method iterates over additional logical addresses.

Example 13 includes the method of any of Examples 8-12, wherein the design of the memory is represented as a register transfer level description configured for execution by the design simulator.

Example 14 includes the method of any of Examples 8-13, wherein the method is implemented in Verilog and conforms to a Universal Verification Methodology.

Example 15 is a method for verification of a design of a memory, the method comprising: using, by a processor-based system, a bit spreading geometry file to convert a logical address of the memory to a physical address, wherein the bit spreading geometry file defines a bit spreading scheme by which data bits of a data word stored at the logical address are stored in a spread fashion over a plurality of random access memories (RAMs) of the memory; causing, by the processor-based system, a design simulator to simulate a write of a test data word to the logical address of the memory; reading, by the processor-based system, data bits from the physical address; arranging, by the processor-based system, the data bits to form a retrieved data word; and comparing, by the processor-based system, the test data word to the retrieved data word to verify the design of the memory.

Example 16 includes the method of Example 15, further comprising: writing data bits of the test data word to the physical address; causing the design simulator to simulate a read from the logical address; and comparing a result of the simulated read to the test data word to further verify the design of the memory.

Example 17 includes the method of Examples 15 or 16, wherein the bit spreading geometry file is configured to specify a logical base address of the memory, a size of the memory, and a description of the each of the plurality of RAMs.

Example 18 includes the method of Example 17, wherein the description of the each of the plurality of RAMs includes a number of blocks of the RAM, a number of bits of each of the blocks of the RAM, and an identifying label of the RAM.

Example 19 includes the method of any of Examples 15-18, wherein the method iterates over additional logical addresses.

Example 20 includes the method of any of Examples 15-18, wherein the design of the memory is represented as a register transfer level description configured for execution by the design simulator and the method is implemented in Verilog and conforms to a Universal Verification Methodology.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A computer program product including one or more non-transitory machine-readable mediums encoded with instructions that when executed by one or more processors cause a process to be carried out for verification of a design of a memory, the process comprising:
   using a bit spreading geometry file to convert a logical address of the memory to a physical address, wherein the bit spreading geometry file defines a bit spreading scheme by which data bits of a data word stored at the logical address are stored in a spread fashion over a plurality of random access memories (RAM s) of the memory;
   writing data bits of a test data word to the physical address;
   causing a design simulator to simulate a read from the logical address; and
   comparing a result of the simulated read to the test data word to verify the design of the memory;
   wherein the bit spreading geometry file is configured to specify a logical base address of the memory, a size of the memory, and a description of the each of the plurality of RAMs.

2. The computer program product of claim 1, wherein the process further comprises:
   causing the design simulator to simulate a write of the test data word to the logical address;
   reading data bits from the physical address;
   arranging the data bits to form a retrieved data word; and
   comparing the test data word to the retrieved data word to further verify the design of the memory.

3. The computer program product of claim 1, wherein the description of the each of the plurality of RAMs includes a number of blocks of the RAM, a number of bits of each of the blocks of the RAM, and an identifying label of the RAM.

4. The computer program product of claim 1, wherein the process iterates over additional logical addresses.

5. The computer program product of claim 1, wherein the design of the memory is represented as a register transfer level description configured for execution by the design simulator.

6. The computer program product of claim 1, wherein the process is implemented in Verilog and conforms to a Universal Verification Methodology.

7. A method for verification of a design of a memory, the method comprising:
   using, by a processor-based system, a bit spreading geometry file to convert a logical address of the memory to a physical address, wherein the bit spreading geometry file defines a bit spreading scheme by which data bits of a data word stored at the logical address are stored in a spread fashion over a plurality of random access memories (RAMs) of the memory;
   writing, by the processor-based system, data bits of a test data word to the physical address;
   causing, by the processor-based system, a design simulator to simulate a read from the logical address; and
   comparing, by the processor-based system, a result of the simulated read to the test data word to verify the design of the memory;
   wherein the bit spreading geometry file is configured to specify a logical base address of the memory, a size of the memory, and a description of the each of the plurality of RAMs.

8. The method of claim 7, further comprising:
   causing the design simulator to simulate a write of the test data word to the logical address;
   reading data bits from the physical address;
   arranging the data bits to form a retrieved data word; and
   comparing the test data word to the retrieved data word to further verify the design of the memory.

9. The method of claim 7, wherein the description of the each of the plurality of RAMs includes a number of blocks of the RAM, a number of bits of each of the blocks of the RAM, and an identifying label of the RAM.

10. The method of claim 7, wherein the method iterates over additional logical addresses.

11. The method of claim 7, wherein the design of the memory is represented as a register transfer level description configured for execution by the design simulator.

12. The method of claim 7, wherein the method is implemented in Verilog and conforms to a Universal Verification Methodology.

13. A method for verification of a design of a memory, the method comprising:
   using, by a processor-based system, a bit spreading geometry file to convert a logical address of the memory to a physical address, wherein the bit spreading geometry file defines a bit spreading scheme by which data bits of a data word stored at the logical address are stored in a spread fashion over a plurality of random access memories (RAMs) of the memory;
   causing, by the processor-based system, a design simulator to simulate a write of a test data word to the logical address of the memory;
   reading, by the processor-based system, data bits from the physical address;
   arranging, by the processor-based system, the data bits to form a retrieved data word; and
   comparing, by the processor-based system, the test data word to the retrieved data word to verify the design of the memory;

wherein the bit spreading geometry file is configured to specify a logical base address of the memory, a size of the memory, and a description of the each of the plurality of RAMs.

14. The method of claim 13, further comprising:
writing data bits of the test data word to the physical address;
causing the design simulator to simulate a read from the logical address; and
comparing a result of the simulated read to the test data word to further verify the design of the memory.

15. The method of claim 13, wherein the description of the each of the plurality of RAMs includes a number of blocks of the RAM, a number of bits of each of the blocks of the RAM, and an identifying label of the RAM.

16. The method of claim 13, wherein the method iterates over additional logical addresses.

17. The method of claim 13, wherein the design of the memory is represented as a register transfer level description configured for execution by the design simulator and the method is implemented in Verilog and conforms to a Universal Verification Methodology.

* * * * *